(12) United States Patent
Benwadih et al.

(10) Patent No.: US 10,957,743 B2
(45) Date of Patent: Mar. 23, 2021

(54) OPTOELECTRONIC ARRAY DEVICE HAVING AN UPPER TRANSPARENT ELECTRODE

(71) Applicants: COMMISSARIAT A L'ENERGIE ATOMIQUE ET AUX ENERGIES ALTERNATIVES, Paris (FR); ISORG, Grenoble (FR); TRIXELL, Moirans (FR)

(72) Inventors: Mohammed Benwadih, Champagny sur Marne (FR); Jean-Marie Verilhac, Coublevie (FR); Simon Charlot, Montferrat (FR); Jérôme Joimel, Grenoble (FR); Pierre Rohr, Moirans (FR)

(73) Assignees: COMMISSARIAT A L'ENERGIE ATOMIQUE ET AUX ENERGIES ALTERNATIVES, Paris (FR); ISORG, Grenoble (FR); TRIXELL, Moirans (FR)

(*) Notice: Subject to any disclaimer, the term of this patent is extended or adjusted under 35 U.S.C. 154(b) by 32 days.

(21) Appl. No.: 16/065,802

(22) PCT Filed: Dec. 19, 2016

(86) PCT No.: PCT/EP2016/081699
§ 371 (c)(1),
(2) Date: Jun. 23, 2018

(87) PCT Pub. No.: WO2017/108670
PCT Pub. Date: Jun. 29, 2017

(65) Prior Publication Data
US 2019/0013361 A1    Jan. 10, 2019

(30) Foreign Application Priority Data
Dec. 23, 2015 (FR) ........................ 1563284

(51) Int. Cl.
*H01L 27/30* (2006.01)
*H01L 51/44* (2006.01)
*H01L 27/146* (2006.01)

(52) U.S. Cl.
CPC ...... *H01L 27/308* (2013.01); *H01L 27/14636* (2013.01); *H01L 27/307* (2013.01);
(Continued)

(58) Field of Classification Search
CPC . H01L 27/3276; H01L 51/56; H01L 51/5221; H01L 51/5206; H01L 27/3246;
(Continued)

(56) References Cited

U.S. PATENT DOCUMENTS 6,215,164 B1    4/2001  Cao et al.
9,551,865 B1 *  1/2017  Kumar ................. G02B 26/005
(Continued)

FOREIGN PATENT DOCUMENTS

DE   10 2007 019327 A1   11/2008
EP      0 721 219 A1      7/1996
(Continued)

*Primary Examiner* — Mouloucoulaye Inoussa
(74) *Attorney, Agent, or Firm* — BakerHostetler

(57) ABSTRACT

A matrix-array optoelectronic device includes a substrate on which a matrix array of what are called bottom electrodes is deposited; an active structure, which is preferably continuous and organic, arranged above the matrix-array of bottom electrodes, the structure being suitable for detecting light; and at least one what is called top electrode lying above the active structure, the top electrode being transparent to the light emitted or detected by the active structure; and at least one conductive element that is borne by the substrate without interposition of the active structure and that is connected to the top electrode by at least one vertical interconnection, the conductive element having an electrical conductivity greater than that of the top electrode. The
(Continued)

device may also comprise a layer made of scintillator material, the layer being fastened to the top electrode, so as to form an x-ray imager.

21 Claims, 6 Drawing Sheets

(52) U.S. Cl.
CPC .......... *H01L 51/441* (2013.01); *H01L 51/445* (2013.01); *Y02E 10/549* (2013.01)

(58) Field of Classification Search
CPC .......... H01L 51/5203; H01L 27/14636; H01L 27/307; H01L 27/308; H01L 51/445; H01L 51/441; H01L 27/301; H01L 31/0504; H01L 27/3297; H01L 31/044; H01L 21/67769; H01L 27/124; Y02E 10/549; H02S 40/30; G02F 1/13452; G02F 1/136286
USPC .................. 438/23, 66; 257/40, 59, E29.273
See application file for complete search history.

(56) References Cited

U.S. PATENT DOCUMENTS

| | | |
|---|---|---|
| 2004/0159793 A1 | 8/2004 | Brabec et al. |
| 2010/0051993 A1* | 3/2010 | Shimoda ............. H01L 27/3246 257/98 |
| 2010/0134735 A1* | 6/2010 | Nakamura .......... H01L 31/1055 349/116 |
| 2011/0227181 A1 | 9/2011 | Inomata et al. |
| 2012/0113376 A1* | 5/2012 | Hayashi ................ H01L 27/124 349/141 |
| 2013/0048863 A1* | 2/2013 | Ohta ..................... H01L 27/308 250/366 |
| 2014/0102507 A1* | 4/2014 | Young .................. H01L 27/301 136/244 |
| 2014/0353609 A1* | 12/2014 | Song .................. H01L 27/3276 257/40 |
| 2015/0001503 A1 | 1/2015 | Hirose |

FOREIGN PATENT DOCUMENTS

| | | |
|---|---|---|
| EP | 2 528 097 A1 | 11/2012 |
| FR | 2 925 222 A1 | 6/2009 |
| WO | 2016/092287 A1 | 6/2016 |

\* cited by examiner

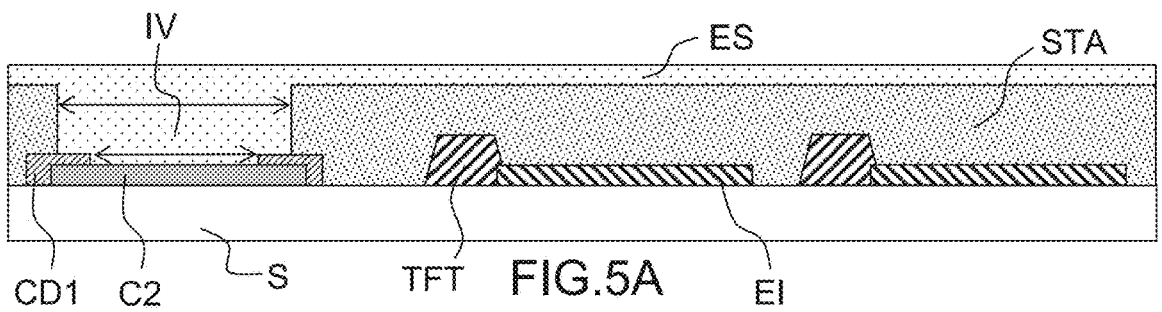
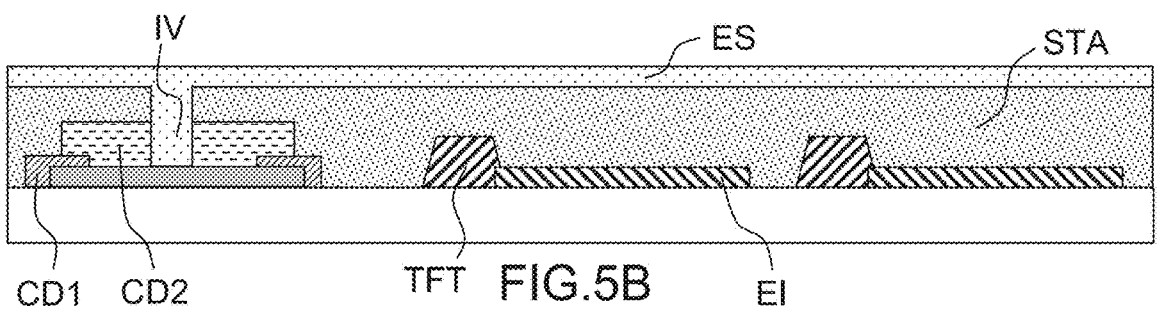
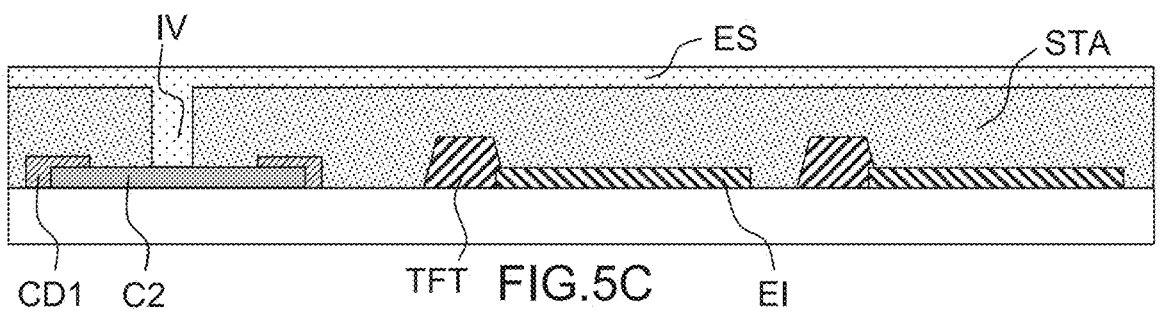
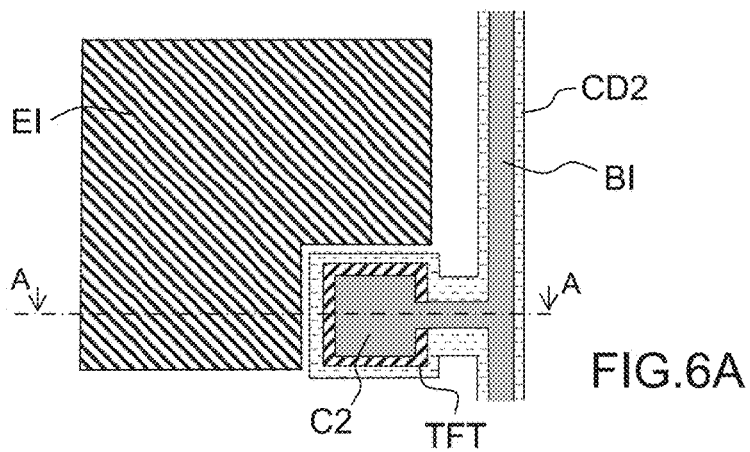
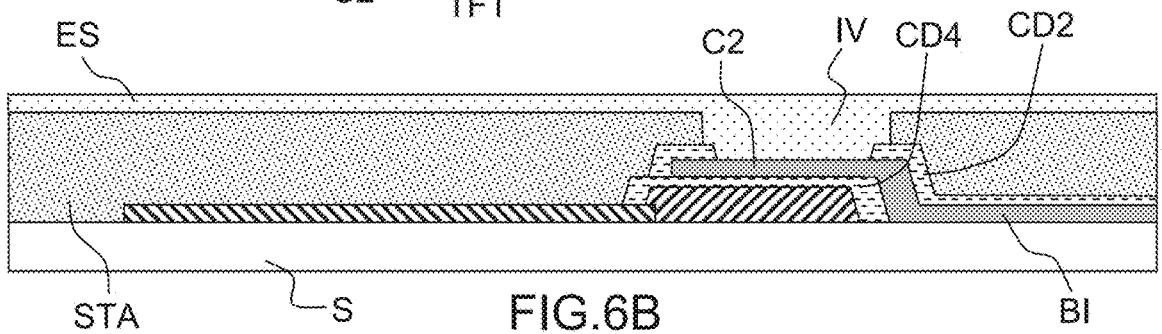

OPTOELECTRONIC ARRAY DEVICE HAVING AN UPPER TRANSPARENT ELECTRODE

CROSS-REFERENCE TO RELATED APPLICATIONS

This application is a National Stage of International patent application PCT/EP2016/081699, filed on Dec. 19, 2016, which claims priority to foreign French patent application No. FR 1563284, filed on Dec. 23, 2015, the disclosures of which are incorporated by reference in their entirety.

FIELD OF THE INVENTION

The invention relates to a matrix-array optoelectronic device of the photodetector-matrix-array (pixelated-imager) type. The invention in particular, but not exclusively, applies to the production of large-area matrix-array x-ray imagers for medical radiology, nondestructive testing or security screening, based on an indirect detection principle and preferably using organic semiconductors.

BACKGROUND

Commonly, in the case of indirect x-ray detection, a scintillator (CsI:Tl, or gadolinium oxysulfide or "Gadox") is coupled, via an adhesive coupling film, to a panel that detects the visible photons emitted by the scintillator when the latter is irradiated by x-ray photons.

This panel is composed of an active matrix array including up to several million pixels. Each pixel comprises at least one photodiode and one thin-film transistor (TFT). The photodiode comprises two electrodes, allowing a bias voltage to be applied thereto: a bottom electrode, which is deposited on the dielectric substrate of the panel, and a top electrode, opposite the substrate. An electrode (typically the bottom electrode) of each photodiode is connected to a column conductor by way of the thin-film transistor, the gate of which is driven by a row conductor. The network of column and row conductors is then connected to contact redistribution pads that are located exterior to the matrix array. In this way, by connecting the exterior pads to a circuit board configured with suitable read sequences, it is possible to read each pixel individually and to thus reconstruct a two-dimensional (2D) image. The other electrode (typically the top electrode) is connected to a bias voltage, which is the same for all the pixels.

The active matrix array may be based on inorganic or organic photodiodes, but the latter are typically made of silicon.

Organic photodiodes on the one hand have the advantage of being able to be produced over large areas by virtue of wet deposition technologies, and on the other hand of requiring only a low thermal budget, thereby allowing them to be hybridized with (integrated into) many existing matrix-array technologies: a-Si:H (amorphous silicon), IGZO (indium-gallium-zinc oxide), OTFT (organic TFTs), CMOS, etc. and with rigid (glass) substrates or flexible (plastic) substrates. FIG. 1A shows a cross-sectional view of one portion of an active matrix array of organic photodiodes. In the figure, the reference S designates the substrate, which is a dielectric (or covered with a dielectric layer; the references EI and ES designate a top and bottom photodiode electrode, respectively; the reference STA designates an active photodiode structure (in the present case, a multilayer or layer that is organic or, more generally, that comprises at least one layer containing at least one organic material); and the reference TFT designates a thin-film transistor. It will be noted that the photodiodes need not necessarily be physically separated from one another, such that the active structure STA may be continuous. Likewise, it is possible to use a single top electrode ES.

FIG. 1B shows a cross-sectional view of a portion of an active matrix array of inorganic photodiodes that are for example made of silicon. This time, the photodiodes must be physically separated from one another; thus, both the active structure STA and the top electrode ES are discontinuous. To ensure that the various portions of the top electrode are at the same potential, they are interconnected by metal buses BS that are generally parallel to the column conductors. These buses are connected together at at least one end, then connected to the exterior circuit via one or more contact redistribution pads (see FIGS. 4A-4E, reference PRC).

Below the case of a matrix array of organic photodiodes will mainly be considered but the invention also applies to the case of inorganic photodiodes.

In order to maximize spatial resolution, the incident light generally arrives from the side of the top electrode, which must therefore be transparent or semitransparent at the wavelength of this light. In the case of inorganic photodiodes, the buses BS are opaque, but sufficiently narrow to absorb only a small portion of the incident light.

Various semi-transparent and conductive top-electrode configurations have already been used in the context of active matrix arrays coupled to a level of organic photodiodes:

metal layers that are sufficiently thin to be semi-transparent (for example 2 nm Ca-10 nm Ag); however, the transmittance obtained is not very satisfactory, typically lower than 60%

ITO (indium-tin oxide) deposited by wet processing; however, the obtained resistivity is much too high (about 1 MΩ/☐)

The organic conductor PEDOT:PSS (poly(3,4-ethylenedioxythiophene):poly(styrene sulfonate)); the resistivity remains high (at least 50Ω/Y) if it is desired to maintain a high transmittance (80% or more).

In the case of inorganic photodiodes, a top electrode made of ITO is most often used. Once again, the resistivity is too high, although it is lower than in the case of organic photodiodes.

The configuration employing PEDOT:PSS is advantageous, in particular in the case of organic photodiodes. Specifically, using PEDOT:PSS for the top electrode allows an organic-photodiode stack with what is called an inverse structure, in which the top electrode plays the role of anode, to be produced. This type of structure allows the stability/reliability of the device to be increased. Furthermore, having the anode above the matrix array is advantageous in the context of x-ray detectors, in so far as the read electronics of present-day x-ray detectors are configured to collect electrons from the bottom electrode (cathode) and holes from the top electrode (anode).

On the other hand, PEDOT:PSS has a higher resistivity than metals, this possibly leading to the creation of artifacts in the images during the read-out of the matrix arrays. Furthermore, this higher resistivity relative to metals tends to limit the use of PEDOT:PSS solely to devices of small areas; however, there is a great need for x-ray detectors of large area (100 cm$^2$ or more).

In order to allow PEDOT:PSS to be used in devices of larger areas, one solution, which was derived from inorganic solar cells, and which was also developed in the context of organic-solar-cell devices (for which large device areas are necessary), is to use a mesh GR of conductive lines that are less resistive than PEDOT:PSS, said mesh being placed on, or under, the surface of the PEDOT:PSS layer (FIG. 2). In this case, the electric charge that flows through the PEDOT:PSS is transferred to the closest mesh point and ends up flowing through the latter in so far as its electrical resistance is lower. In addition to its ability to decrease the resistivity of the top electrode, the mesh, which by definition is localized spatially, allows the top electrode to be connected to the exterior circuit just like the contact redistribution pads. The mesh may therefore have a dual function, that of decreasing the resistivity of the top electrode and that of connecting the top electrode to an exterior circuit. These meshes are generally metal in nature. They may be deposited by evaporation, sputtering or electrodeposition, or microfluidically, or by printing of a conductive ink, such as for example an Ag ink, by screen printing. Generally, this mesh is produced with a material that is opaque to light; however, its mesh structure with many empty zones (devoid of material) allows the top electrode to preserve a good transmittance on average over the area covered thereby. The conductive lines of the mesh are typically about a few microns (μm) to a few hundred microns in width.

The use of such a mesh on the top electrode in the case of x-ray detectors is disadvantageous. Specifically, the dimensions of the conductive lines of the mesh are of the same order of magnitude as the dimensions of the pixels (~80-150 μm). Thus, the zone occupied by the mesh will (completely or partially) mask certain pixels, with the unacceptable effect of making certain zones of the area of the matrix array inactive. This may be seen on the right-hand side of FIG. 2.

SUMMARY OF THE INVENTION

The invention aims to overcome the aforementioned drawbacks of the prior art. More particularly it aims to mitigate drawbacks due to the resistivity of the transparent conductive materials (PEDOT:PSS, ITO, inter alia) used to produce the top electrodes of the active matrix arrays, while preserving a maximum transmittance. Up to now, only the case of an x-ray imager has been considered, but the problem also affects optical imagers (comprising no scintillator). According to the invention, this aim is achieved by virtue of the use of a highly conductive (and possibly opaque) "mesh" borne by the substrate without interposition of the active structure. This mesh may be borne directly by the substrate, or be located entirely or partially above the thin-film transistors (which do not participate directly in the detection of light and thus form "blind" zones). It may be located under the active structure, or in a peripheral region of the device where the active structure is not present. In any case, it is connected to the transparent top electrode by vertical interconnections.

The subject of the invention is therefore a matrix-array optoelectronic device comprising:

an electrically insulating substrate bearing, on one of its surfaces, a matrix array of what are called bottom electrodes;

an active structure arranged above said matrix-array of bottom electrodes, said structure being suitable for detecting light;

and at least one what is called top electrode lying above said active structure, said top electrode being transparent to the light emitted or detected by the active structure;

also comprising at least one conductive element that is borne by the substrate without interposition of said active structure and that is connected to said top electrode by at least one vertical interconnection, said conductive element having an electrical resistivity lower than that of said top electrode;

wherein said or each said vertical interconnection is formed from a material having a work function of value chosen so that the application, across the top electrode and at least the bottom electrodes that are closest to said vertical interconnection, of a potential difference that allows said active structure to detect said light, causes the appearance of a potential barrier that prevents the injection of parasitic electrical charge into said bottom electrodes through the active structure.

BRIEF DESCRIPTION OF THE DRAWINGS

Other features, details and advantages of the invention will become apparent on reading the description, which is given with reference to the appended drawings, which are given by way of example and show, respectively:

FIGS. 5A to 5C, various variants of a matrix-array optoelectronic device according to a second embodiment of the invention;

FIGS. 6A and 6B, a device according to one variant of a third embodiment of the invention;

DETAILED DESCRIPTION

Figure 1A:
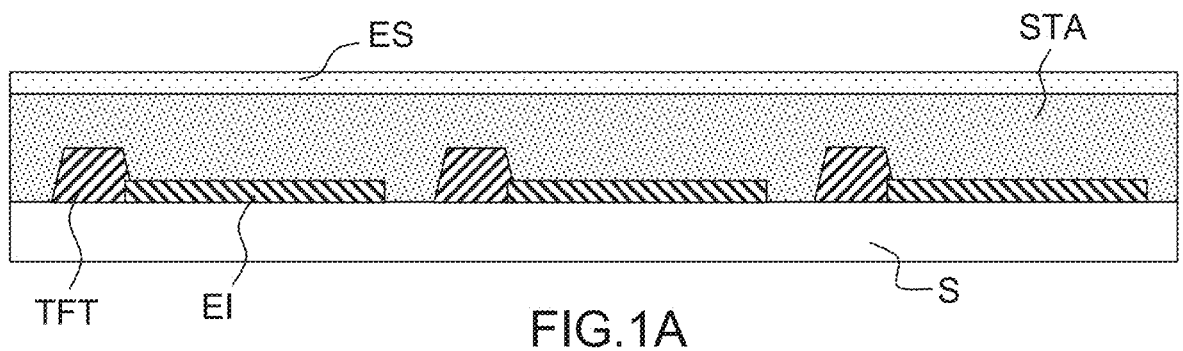
FIG. 1A is a cross-sectional view of a portion of an active matrix array of organic photodiodes according to the prior art.
Figure 1B:
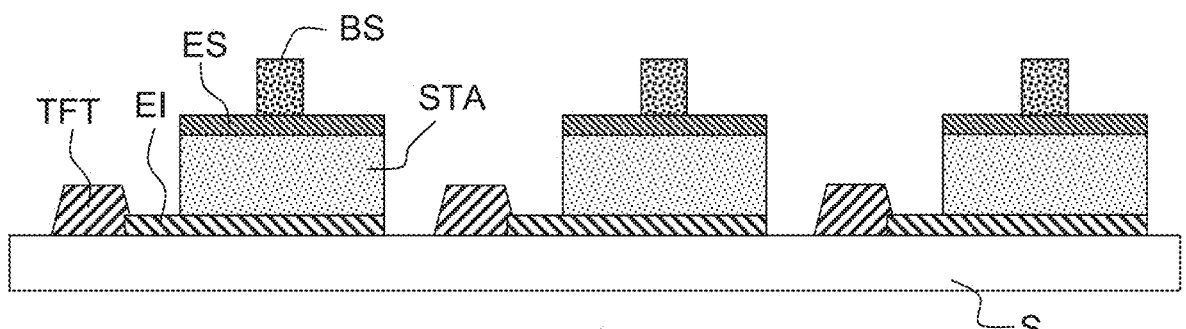
FIG. 1B is a cross-sectional view of a portion of an active matrix array of inorganic photodiodes according to the prior art.
Figure 2:
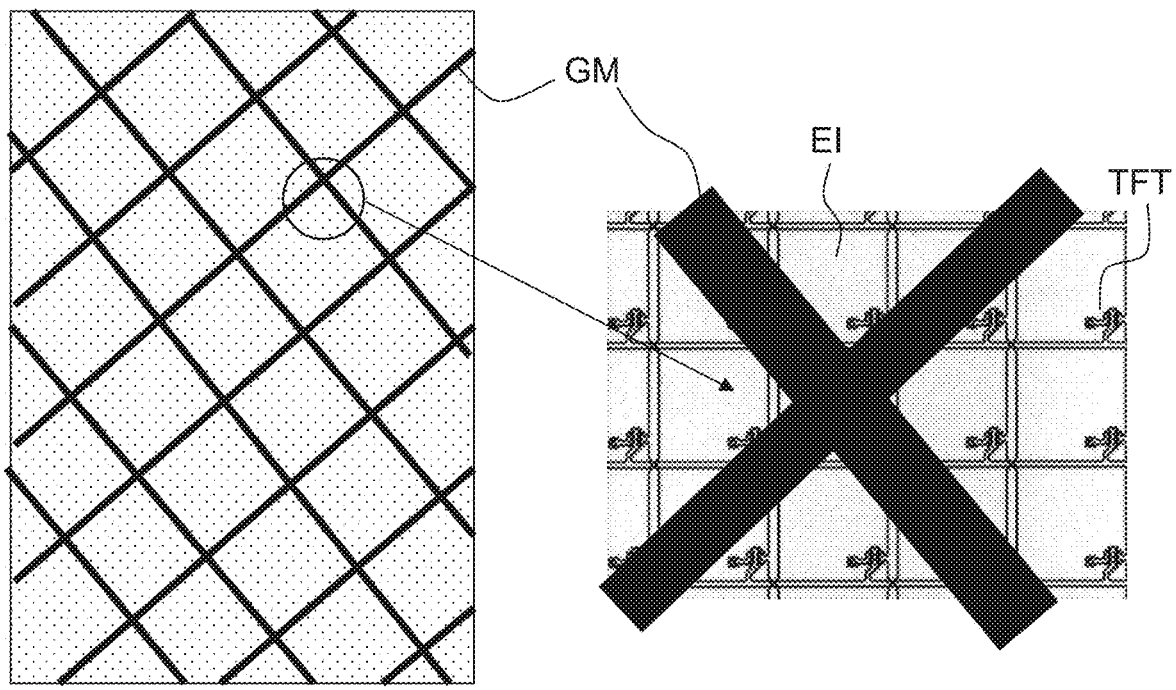
FIG. 2 illustrates a solution, known from the prior art, to decrease the resistivity of the top electrode of a large area matrix of organic photodiodes.
Figure 3:
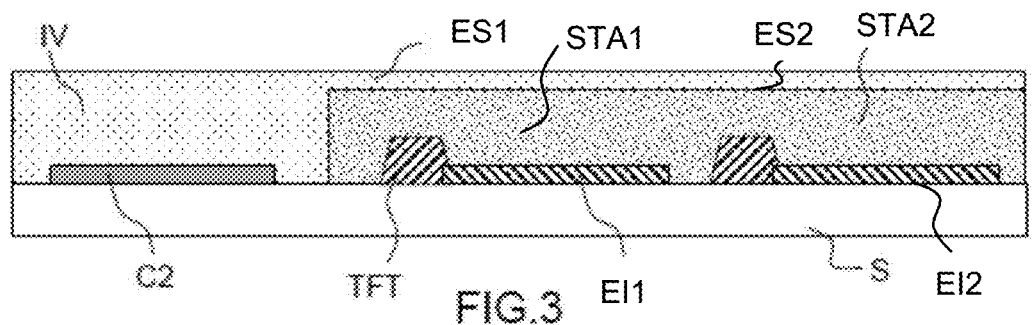
FIGS. 3 and 4A to 4E, various variants of a matrix-array optoelectronic device according to a first embodiment of the invention.

FIG. 3 shows a cross-sectional view of a matrix-array optoelectronic device according to a first embodiment of the invention. The device has a structure similar to that illustrated in FIG. 1A, which was described above: it comprises a substrate S, which is electrically insulating (or made insulating by a dielectric layer), on a surface of which what are called bottom electrodes EI forming a matrix array have been deposited; thin-film transistors TFT that are connected to the electrodes; an active structure STA (photoconverting layer or structure) of the organic-photodiode type covering the matrix array of bottom electrodes; and a transparent top electrode ES, which is for example made of PEDOT:PSS. It differs from the device of FIG. 1A in the presence of a conductive element C2 borne by the surface of the substrate S, which is electrically connected to the top electrode ES by a vertical interconnection IV that is made of conductive material.

Figures 4A, 4B, 4C, 4D:
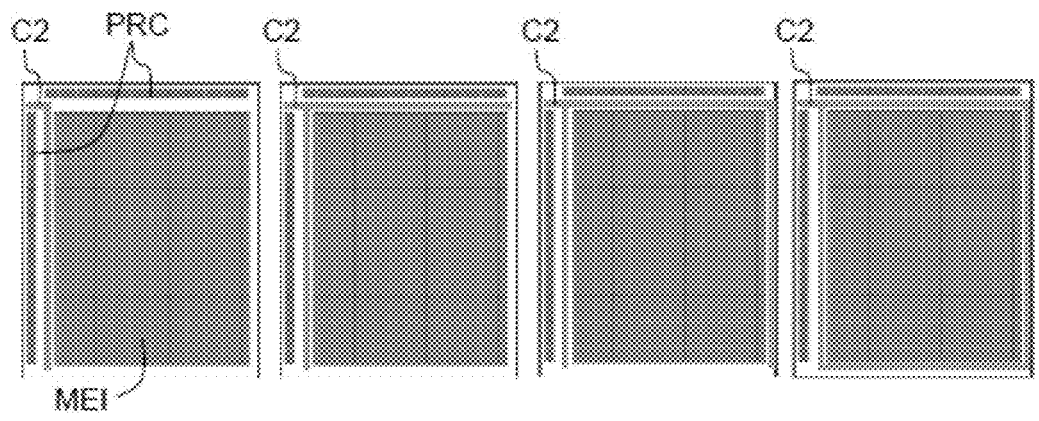
Figure 4E:
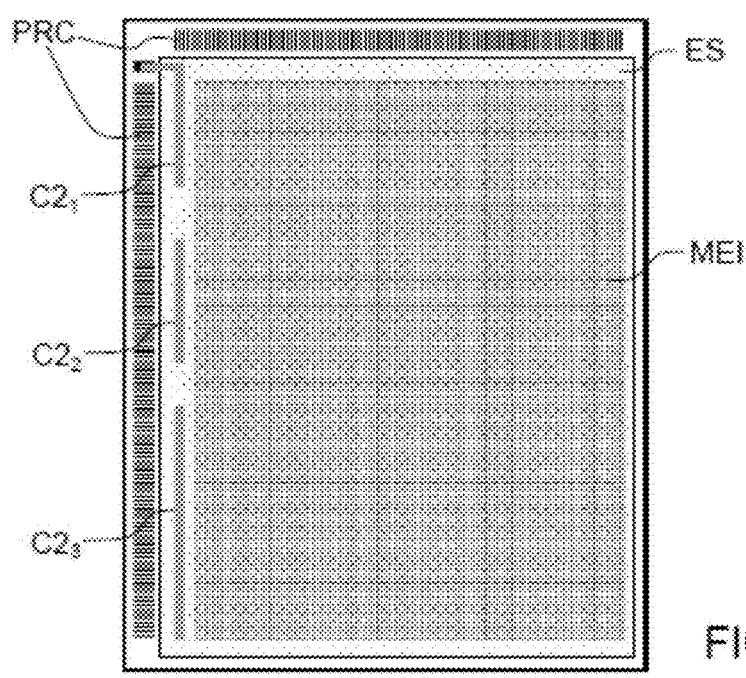

The conductive element C2 is located beyond the perimeter occupied by the matrix array MEI of bottom electrodes and takes the form of a metal bus that borders all or some of the perimeter of this matrix array. Preferably, it may be located between the matrix array MEI and contact redistribution pads PRC (FIGS. 4A to 4E). Generally, the matrix arrays are rectangular, but not necessarily. Thus, in the case where the matrix array is rectangular, the element C2 borders all or some of at least one side of the matrix array (FIG. 4A). Preferably, it borders two sides of the matrix array (FIG. 4B). In certain cases, it may border three sides of the matrix array (FIG. 4C) or even completely encircle the matrix array (FIG. 4D). Preferably, the bus C2 is continuous, though it may be discontinuous locally if there is a particular need for it to be so; in this case, it is the top electrode that ensures the electrical continuity in the discontinuous zones $C2_1$, $C2_2$, $C2_3$ (FIG. 4E). In any case, the bus/conductive element C2 makes electrical contact with at least one contact redistribution pad, thereby making it possible to apply thereto a voltage that is transmitted to the top electrode. Advantageously, the resistance between the top electrode and the bus/conductive element C2 will be lower than or equal to 20Ω.

For an x-ray detecting panel with an active matrix array of 284.16 mm×230.88 mm area, the bus C2 is advantageously L-shaped, namely it borders two sides of the matrix array, and the area of contact between the bus C2 and the PEDOT:PSS top electrode is comprised between 140 mm$^2$ and 600 mm$^2$. Preferably, this area is 520 mm$^2$.

In the embodiment of FIG. 3, the vertical interconnection IV extends over the edge face of the active structure STA and, if no precaution were taken, a parasitic injection of electrical charge from the vertical interconnection into nearby neighboring bottom electrodes could take place through the active layer. To avoid this, it is possible to choose, for the material from which the vertical interconnection is made, a material having a work function chosen, i.e. such that, when the device is biased so as to ensure normal operation thereof (reverse bias if it is a question of a photodiode, i.e. negative bias on the anode electrode with the cathode grounded), a potential barrier forms between the vertical interconnection and the structure STA, preventing the injection of carriers from the vertical interconnection into said structure STA. The height of this barrier must be at least 0.3 eV and preferably at least 0.5 eV. More particularly:

If the active structure STA forms a photodiode and the top electrode ES is the anode of this photodiode, the potential barrier between the vertical interconnection and the active structure must be large enough to prevent the injection of electrons from the interconnection into the multilayer structure when the top electrode is negatively biased and in the dark.

If the active structure STA forms a photodiode and the top electrode ES is the cathode of this photodiode, the potential barrier between the vertical interconnection and the active structure must be large enough to prevent the injection of holes from the interconnection into the multilayer structure when the top electrode is positively biased and in the dark.

These conditions are met automatically if the vertical interconnection is made from the same material (PEDOT:PSS for example) as the top electrode ES, which solution is also the simplest to implement from the technological point of view.

As a variant or in addition, the vertical interconnection may be physically separated from the active structure, for example by a trench or by an insulating material.

Of course, the following conditions must also be met to avoid short-circuits:

the element C2 must not make direct electrical contact with the bottom electrodes EI or with the column and row conductors; and the top electrode ES must not make direct electrical contact with the bottom electrodes EI or with the column and row conductors.

This goes for all the embodiments of the invention.

A matrix-array detector according to this embodiment of the invention was produced on a (0.7×311.4×251.4 mm) glass panel including an active matrix array of 284.16 mm×230.88 mm size. This matrix array was composed of a-Si:H TFTs each of which was connected to a bottom electrode EI with a surface made of ITO. The pitch of the matrix array was 148 μm. On its surface, the matrix array was bordered on two sides (side of the row contact redistribution pads and side of the column contact redistribution pads) with an L-shaped conductive bus C2 (see FIG. 4B) composed of a multilayer of 100 nm Cr and 20 nm ITO. The Cr ensured the mechanical adhesion of the bus and the conductivity of the bus, whereas the ITO ensured the electrical contact with the top electrode. The width of the bus was 1 mm, the arm of the L on the column-pad side had a length of 231 mm and the arm of the L on the row-pad side had a length of 290 mm. The bus was connected to a contact redistribution pad exterior to the matrix array. The distance between the bus and the edge of the matrix array was 3 mm. A layer of ZnO of 30 nm was deposited by cathode sputtering on the surface of the bottom electrodes of the matrix array in order to decrease the work function of the ITO to a level suitable for a cathode. The ZnO protruded from the matrix array by 0.5 mm. Next, a photoconverting layer, forming the active structure STA, was deposited, in the solvent 1,2-dichlorobenzene, by spin coating, its dry thickness after thermal annealing being 400 nm. This layer was a nanostructured mixture of an electron-donor material (poly[2,1,3-benzothiadiazole-4,7-diyl[4,4-bis(2-ethylhexyl)-4H-cyclopenta[2,1-b:3,4-b']dithiophene-2,6-diyl]], known as PCPDTBT) and of an electron-acceptor material ([6,6]-phenyl-$C_{61}$-butyric-acid-methyl-ester, known as [60] PCBM) with a mass ratio of 1:1. The photoconverting layer covered all the matrix array and stopped 1 mm beyond the ZnO layer. A PEDOT:PSS layer was then deposited by spin coating on the photoconverting layer so as to form a top electrode ES. This PEDOT:PSS layer had a thickness of 300 nm, a resistivity of 240Ω/□, and a transmittance of 92% at the wavelength of 520 nm, corresponding to the emission of a scintillator made of CsI:Tl or Gadox. The top electrode ES made of PEDOT:PSS made contact with all of the surface provided therefor of the Cr-ITO bus. An encapsulation composed of a barrier pressure sensitive adhesive (PSA) and of a barrier film and having a total thickness of 75 μm was then laminated onto the surface of the PEDOT:PSS so as to cover all of the area covered by the organic layers (photoconverting layer STA and layer of PEDOT:PSS forming the top electrode ES). A (30 μm thick) double-sided adhesive was laminated onto the surface of the barrier film. A CsI:Tl scintillator the fibers of which were grown on an aluminum substrate was then laminated onto this adhesive. The edges of the substrate were passivated by depositing a bead of silicon-containing adhesive. The contact redistribution pads on two sides of the panel were connected to a printed circuit board (PCB) including the electronics for reading the matrix array, by way of flexible connectors combined with an anisotropic-conductive-film (ACF) adhesive so as to allow a digital image to be acquired.

FIGS. 5A to 5C show cross-sectional views of matrix-array optoelectronic devices according to three variants of a second embodiment of the invention. As in the case of FIG. 3, a vertical interconnection IV connects the transparent top electrode ES to a conductive element C2 deposited on the substrate and located exterior to the matrix array of bottom electrodes. In contrast to the case of FIG. 3 however, the active structure STA covers the conductive element C2 and is therefore passed through by the vertical interconnection IV In this embodiment, it is important to ensure that a direct contact between the bottom portion (close to the substrate) of the active structure STA and the conductive element C2—which is at the potential of the top electrode ES—does not cause a flow of parasitic electrical currents to nearby neighboring bottom electrodes, through the active layer. This may in particular be done in three ways, which are illustrated by FIGS. 5A-5C.

Firstly, the vertical interconnection IV (which, as was explained above with reference to FIG. 3, has a work function chosen to prevent any injection of parasitic electrical charge) may be wider than the uninsulated upper surface of the conductive element C2 so as to physically separate the latter from the active structure STA. This possibility is illustrated in FIG. 5A.

Secondly, a dielectric layer CD2 may cover the top surface of the conductive element C2 so as to insulate it from the active structure STA. This dielectric layer is passed through by the vertical interconnection IV. This possibility is illustrated in FIG. 5B.

Thirdly, the conductive element C2 may be made of a material (example: Au in the case where the top electrode ES plays the role of anode) having a work function that is chosen to allow the appearance of a potential barrier with the active structure STA, just like the material of the vertical interconnection. This possibility is illustrated in FIG. 5C.

In these three variants of the second embodiment of the invention, which are illustrated in FIGS. 5A to 5C, the edges of the conductive element C2 are covered with a thin dielectric layer CD1, which is not essential but is generally present when the level C2 is not produced in the last manufacturing step of the matrix array.

A matrix-array detector according to this embodiment of the invention, and more precisely in the configuration of FIG. 5B, was produced on a (0.7×311.4×251.4 mm) glass panel including an active matrix array of 284.16 mm×230.88 mm size. This matrix array was composed of IGZO TFTs each of which was connected to a bottom electrode EI with a surface made of Cr. The pitch of the matrix array was 80 µm. On its surface, the matrix array was bordered on 2 sides (side of the row contact redistribution pads and side of the column contact redistribution pads) with an L-shaped conductive bus C2 composed of a multilayer of 100 nm TiW and 100 nm ITO. The TiW ensured the mechanical adhesion of the bus and its conductivity; the ITO ensured the electrical contact with the top electrode. The width of the bus was 1 mm, the arm of the L on the row-pad side had a length of 231 mm and the arm of the L on the row-pad side had a length of 290 mm. The bus was connected to contact redistribution pads exterior to the matrix array, in ten locations. The distance between the bus and the edge of the matrix array was 2 mm. In the zones provided for the contact with the top electrode, the bus was covered with an organic dielectric layer CD2 (negative photoresist SU8) of 1 µm thickness. A photoconverting layer was deposited, in the solvent mesitylene, in a coating operation, its dry thickness after thermal annealing being 200 nm. This layer was a nanostructured mixture of an electron-donor material (regioregular poly(3-hexylthiophene), known as RR-P3HT) and of an electron-acceptor material (di[1,4]methanonaphthaleno [1,2:2',3',56,60:2",3"][5,6]fullerene-C60-Ih, known as ICBA) with a mass ratio of 1:2. The photoconverting layer covered all the matrix array and the surface of the peripheral bus. Circular vias, with a diameter of 300 µm and a spacing also of 300 µm, and which opened onto the ITO layer of the bus C2, were formed by laser ablation (248 nm excimer laser, 450 mJ pulse) of the photoconverting layer and of the SU8 resist from the bus surface intended to make contact with the top electrode. Next, a PEDOT:PSS layer was deposited by spin coating on the photoconverting layer so as to form said top electrode ES. The PEDOT:PSS layer had a thickness of 300 nm, a resistivity of 240Ω/□, and a transmittance of 92% at the wavelength of 520 nm, corresponding to the emission of a scintillator made of CsI:TI or Gadox. The PEDOT:PSS made contact with the TiW-ITO bus through the vias provided to this end. An encapsulation composed of a barrier adhesive and of a barrier film and having a total thickness of 75 µm was laminated onto the surface of the PEDOT:PSS so as to cover all of the area covered by the organic layers (photoconverting layer and layer of PEDOT:PSS). A (30 µm thick) double-sided adhesive was laminated onto the surface of the barrier film. A Gadox scintillator was then laminated onto this adhesive. The edges of the substrate were passivated by depositing a bead of silicone. The contact redistribution pads on two sides of the panel were connected to a printed circuit board (PCB) including the electronics for reading the matrix array, by way of flexible connectors combined with an ACF adhesive so as to allow a digital image to be acquired.

FIGS. 6A to 10 illustrate various variants of a third embodiment of the invention, in which the vertical interconnections IV pass through the active structure STA and make contact with one or more conductive elements C2 that are located interior to the active matrix array of bottom electrodes EI and transistors TFT. As in the embodiments considered above, the or each bus/conductive element C2 is electrically connected to at least one contact redistribution pad, thereby allowing a voltage to be applied thereto, which voltage is transmitted to the top electrode. The precautions described above and intended to prevent the parasitic injection of carriers into the active structure from the vertical interconnections and the conductive elements C2 also apply.

Advantageously, this embodiment makes provision for the use of a plurality of connecting elements C2 forming a mesh that follows the mesh of the matrix array, namely the mesh of rows and/or columns. Preferably, the conductive elements C2 making contact with the vertical interconnections IV are connected together by buses BI that are parallel to the columns. These buses parallel to the columns are then electrically connected together at the ends of the columns, and are connected to one or more contact redistribution pads on the periphery of the matrix array. The buses are electrically disconnected from the rows and columns of the matrix array. They surround packets of pixels or of rows or columns. By packet, what is meant is groups of about 1, 10, 100, 1000, 10000, 100000, 1000000, 10000000 or more pixels or rows or columns.

FIGS. 6A (top view) and 6B (cross section cut along A-A) illustrate the case where an element C2 is arranged above a transistor TFT and separated from the latter and from the active structure STA by a dielectric material CD4, which may be the same used to produce the insulating layer CD2, or be a different material. This embodiment has the advantage of not decreasing the useful area of the active matrix array, and therefore the effectiveness with which light is generated or detected. In this case, there may be up to one element C2 in alignment with each pixel, but preferably there will rather be one element C2 per packet of 100, 1000 or even 10,000 pixels or more.

Figure 6C:
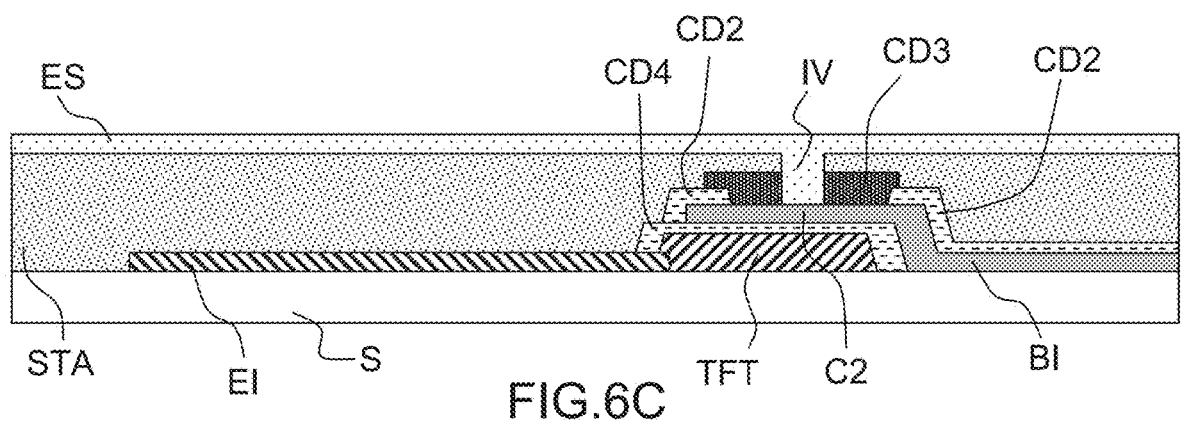
FIG. 6C, a device according to another variant of said third embodiment of the invention.
Figure 7A:
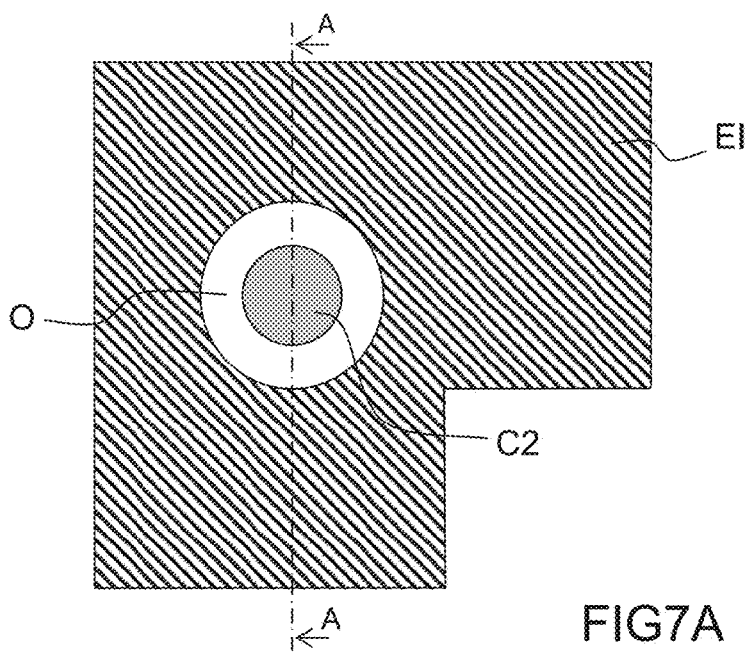
FIGS. 7A and 7B, a device according to another variant of said third embodiment of the invention.
Figure 7B:
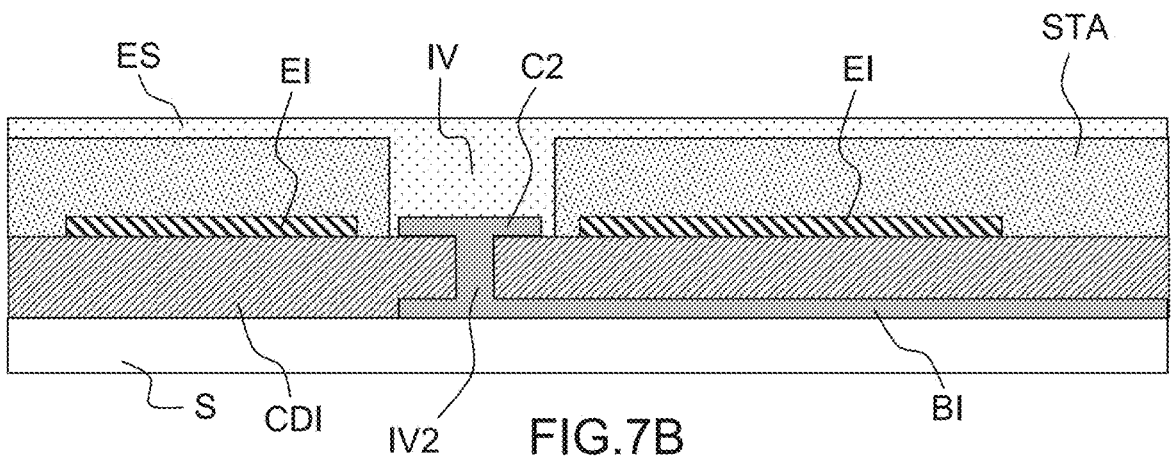

FIG. 6C shows a device that is similar to the device of FIGS. 6A and 6B but in which a dielectric layer CD3 is used to prevent any direct contact between the element C2 and the active structure STA. This device was produced on a (0.7× 311.4×251.4 mm) glass panel including an active matrix array of 284.16 mm×230.88 mm size. This matrix array was composed of a-Si:H TFTs each of which was connected to a bottom electrode EI the surface of which was made of Al. The pitch of the matrix array was 150 μm. A secondary network of conductive elements C2 was integrated into the interior of the matrix array. This network was not electrically connected to the rows and columns, but was connected to 10 contact redistribution pads exterior to the matrix array. It took the form of buses BI parallel to the columns. There was one bus BI every 10 columns, and each bus BI was connected by 100 vertical interconnections IV to the top electrode. The network C2 was a Cr/ITO bi-layer of 100 nm/20 nm thickness. To produce the conductive elements C2, the area occupied by the TFT in the pixel was used. Each Cr/ITO pixel segment dedicated to the contact redistribution zone was passivated with a 500 nm thickness of the dielectric resist SU8 (reference CD3 in the figure) in order to prevent any direct contact with the photoconverting layer (active structure STA), which was deposited subsequently. Next, the photoconverting layer STA was deposited, in the solvent chlorobenzene, by spin coating, its dry thickness being 600 nm after thermal annealing. This layer was a nanostructured mixture of an electron-donor material (PCDTBT) and of an electron-acceptor material ([60]PCBM) with a mass ratio of 1:1. Vias passing through the photoconverting layer and the SU8 dielectric resist were formed by laser ablation (248 nm excimer laser, 450 mJ pulse) in order to make it possible to form an electrical contact between the ITO of each element C2 and the top electrode. Next, a PEDOT:PSS layer forming the top electrode ES was deposited by slot-die coating on the photoconverting layer. The PEDOT:PSS layer had a thickness of 1.1 μm, a resistivity of 50Ω/□, and a transmittance of 73% at the wavelength of 520 nm, corresponding to the emission of a scintillator made of CsI:Tl or Gadox. The PEDOT-PSS made contact with the elements C2 through the vias. An encapsulation composed of a barrier PSA and of a barrier film and having a total thickness of 75 μm was laminated onto the surface of the PEDOT:PSS so as to cover all of the area covered by the organic layers (photoconverting layer and layer of PEDOT:PSS). A (30 μm thick) double-sided adhesive was laminated onto the surface of the barrier film. A CsI:Tl scintillator the fibers of which was grown on an aluminum substrate was then laminated onto this adhesive. The edges of the substrate were passivated by depositing a bead of silicone. The contact redistribution pads on two sides of the panel were connected to printed circuit board (PCB) including the electronics for reading the matrix array, by way of flexible connectors combined with an ACF adhesive so as to allow a digital image to be acquired. FIGS. 7A (top view) and 7B (cross section cut along A-A) illustrate the case where an element C2 is arranged in an aperture O in a bottom electrodes EI. This aperture preferably occupies an area no larger than 10% of the area of the bottom electrode. FIG. 7B shows that the vertical interconnection IV that connects the top electrode ES to the element C2 is wide enough to prevent any contact between this element and the active structure STA. The interconnecting buses BI connecting the elements C2 together are buried: they are deposited directly on the substrate S, whereas the bottom electrodes EI, the element C2 and the active structure STA are produced above a dielectric layer CDI deposited thereon. Vertical interconnections IV2 pass through this dielectric layer in order to connect the element C2 to the buses BI. As in the case of FIGS. 6A-6C, there may be up to one element C2 in alignment with each pixel, but preferably there will rather be one element C2 per packet of 1000, or even 10,000 pixels or more. The resistance between the top electrode and the contact redistribution pads decreases as the number of elements C2 increases, but each element C2 encroaches on the area of a bottom electrode and therefore decreases the effectiveness with which the matrix-array device generates or detects light.

Figure 7C:
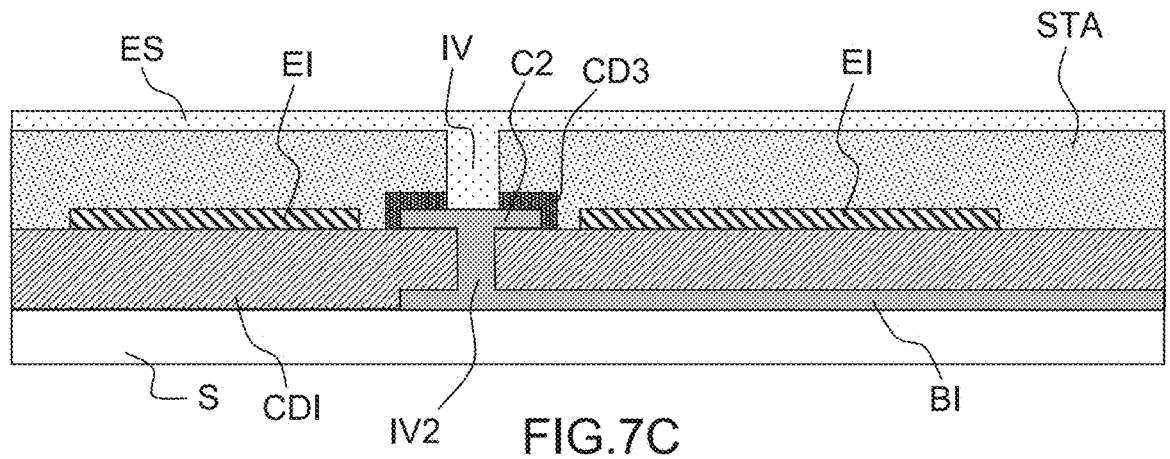
FIG. 7C, a device according to another variant of said third embodiment of the invention.

FIG. 7C shows a device that is similar to the device of FIGS. 7A and 7B and in which a dielectric layer CD3 is used to prevent any direct contact between the element C2 and the active structure STA.

Figure 8:
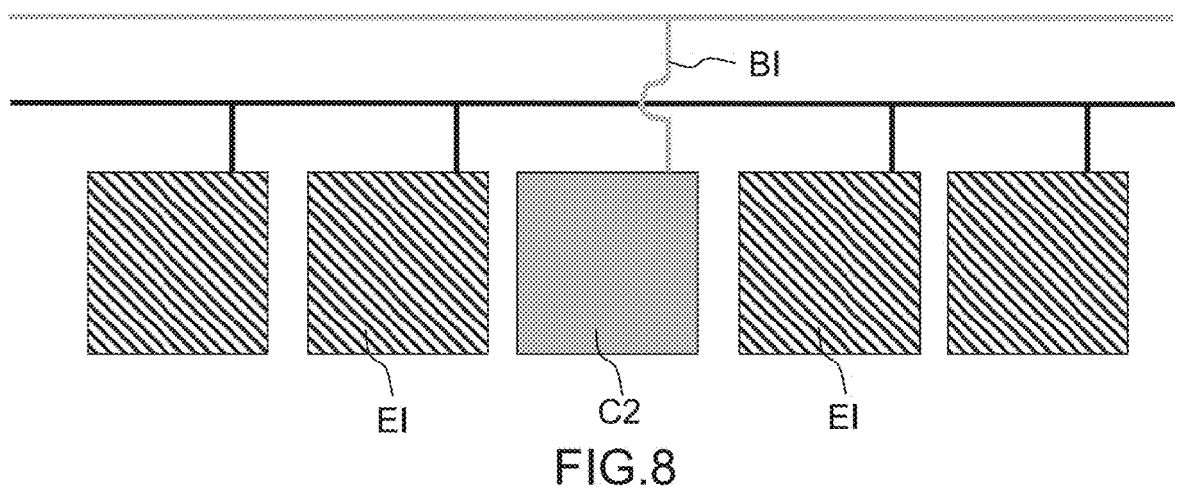
FIG. 8, a device according to another variant of said third embodiment of the invention.

FIG. 8 relates to the case where one or more bottom electrodes EI of the active matrix array are "sacrificed" in order to leave room for the conductive elements C2. In the example illustrated in the figure, one electrode EI has been replaced by one isolated conductive element C2, in other cases, a plurality of contiguous electrodes EI could be replaced by a plurality of conductive elements. Typically, there will be one contact zone, formed by one or more contiguous elements C2, per packet of 1000 or even 10,000 pixels or more. The resistance between the top electrode and the contact distribution pads decreases as the number of elements C2 increases, but each element C2 replaces one bottom electrode and therefore decreases the effectiveness with which the matrix-array device generates or detects light. Software corrections will possibly and advantageously be applied in the subsequent processing of the image in order prevent these "dead" pixels of the matrix array from appearing in the image. These types of corrections are known to those skilled in the art. For example, a sacrificed pixel may be replaced by an artificial pixel having a current level that corresponds to the average of the current levels read by its nearest neighbors.

Figure 9A:
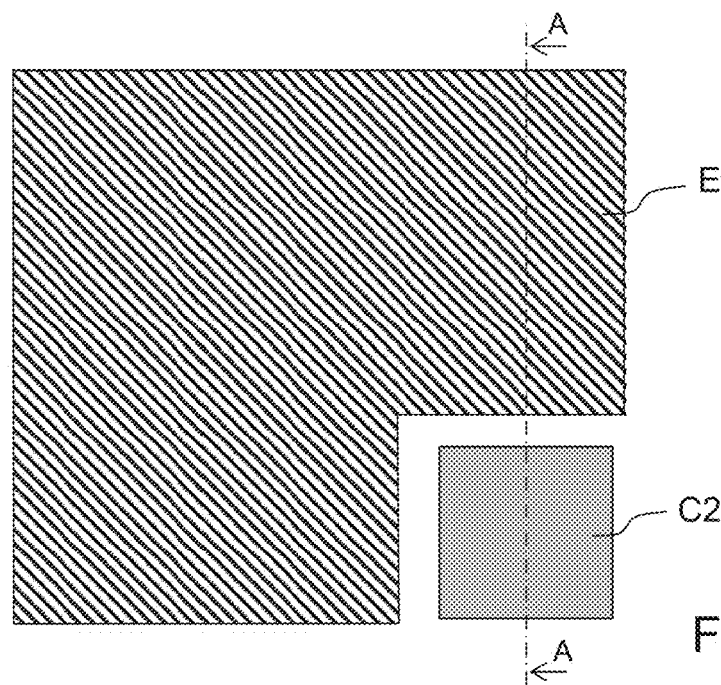
FIGS. 9A and 9B, a device according to another variant of said third embodiment of the invention.

A matrix-array device of this type was produced on a (0.7×311.4×251.4 mm) glass panel including an active matrix array of 284.16 mm×230.88 mm size. This matrix array was composed of a-Si:H TFTs each of which was connected to a bottom electrode EI the surface of which was made of FTO (fluorine-doped tin oxide). The pitch of the matrix array was 150 μm. A secondary network formed from elements C2 and interconnecting buses BI was integrated into the interior of the matrix array. Said buses were parallel to the columns, each bus being connected by a vertical interconnection to the top electrode. Each element C2 replaced one electrode of the active matrix array, therefore requiring one pixel to be sacrificed. The elements C2 and the buses BI were formed from a Cr/ITO bi-layer of 100 nm/20 nm thickness. Next, a photoconverting layer STA was deposited, in the solvent chlorobenzene, by spin coating, its dry thickness after thermal annealing being 600 nm. This layer was a nanostructured mixture of an electron-donor material (PCDTBT) and of an electron-acceptor material (([60]PCBM) with a mass ratio of 1:1. Vias were opened in each sacrificial pixel in order to make it possible to form a zone of contact between the ITO of the element C2 and the top electrode. The area of the vias was larger than the non-passivated area of the elements C2, in order to avoid the parasitic injection of carriers into the active structure. The vias passed through the photoconverting layer. The vias were produced by photolithography, using a fluorine-containing resist sold by Orthogonal under the reference OSCoR4000. The vias were opened by etching the photoconverting layer in a plasma (80 mT, 100 sccm $O_2$, 400 W, 1000 s). The resist was then removed in a specific solvent (stripper). Next a PEDOT:PSS layer was deposited by slot-die coating on the photoconverting layer so as to form the top electrode. The PEDOT:PSS layer had a thickness of 1.1 µm, a resistivity of 50Ω/☐, and a transmittance of 73% at the wavelength of 520 nm, corresponding to the emission of a scintillator made of CsI:Tl or Gadox. The PEDOT:PSS made contact with the conductive elements C2 through the vias. An encapsulation composed of a barrier adhesive and of a thin glass and having a total thickness of 65 µm was laminated onto the surface of the PEDOT:PSS so as to cover all the area covered by the organic layers (photoconverting layer and layer of PEDOT:PSS). A (30 µm thick) double-sided adhesive was laminated onto the surface of the barrier film. A CsI:Tl scintillator the fibers of which were grown on an aluminum substrate was then laminated onto this. The edges of the substrate were passivated by depositing a bead of silicone. The contact redistribution pads on two sides of the panel were connected to a printed circuit board (PCB) including the electronics for reading the matrix array, by way of flexible connectors combined with an ACF adhesive so as to allow a digital image to be acquired. FIGS. 9A (top view) and 9B (cross section cut along A-A) illustrate the case where an element C2 encroaches on a segment—preferably no larger than 20% or even 10%—of the area of a bottom electrode. More particularly, the element C2 occupies an aperture O located on the edge of the bottom electrode.

As in the case of FIGS. 6A-6C and 7A-7C there may be up to one element C2 in alignment with each pixel, but preferably there will rather be one element C2 per packet of 1000, or even 10,000 pixels or more. The resistance between the top electrode and the contact redistribution pads decreases as the number of elements C2 increases, but each element C2 encroaches on the area of a bottom electrode and therefore decreases the effectiveness with which the matrix-array device generates or detects light.

Figure 9B:
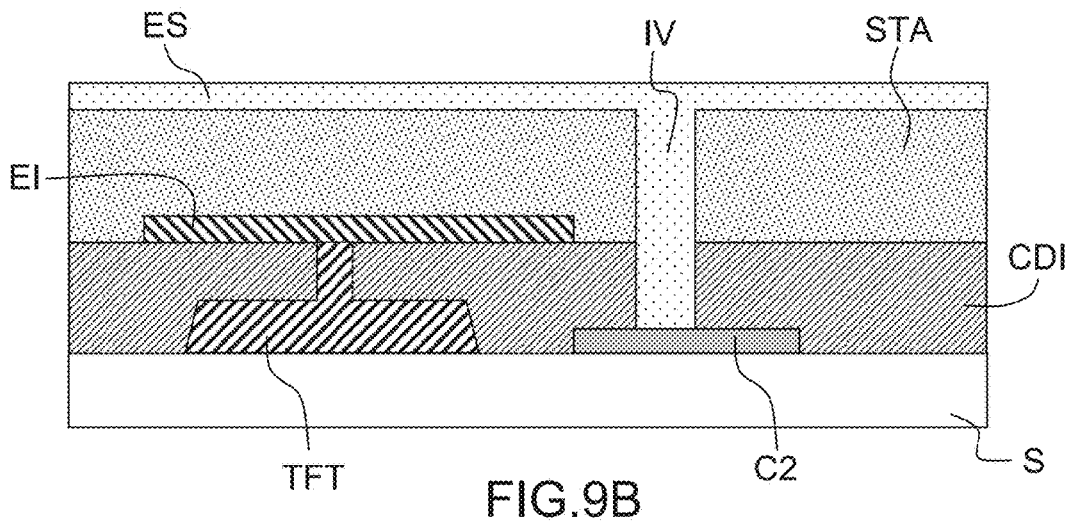

FIG. 9B shows that the conductive elements C2 (and the interconnecting buses BI, the latter not being shown) are buried: they are deposited directly on the substrate S, whereas the bottom electrodes EI and the active structure STA are produced above a dielectric layer CDI that is deposited thereon. The transistors TFT are produced directly on the substrate, under the respective electrodes EI, so as to not to encroach upon their area.

Figure 10:
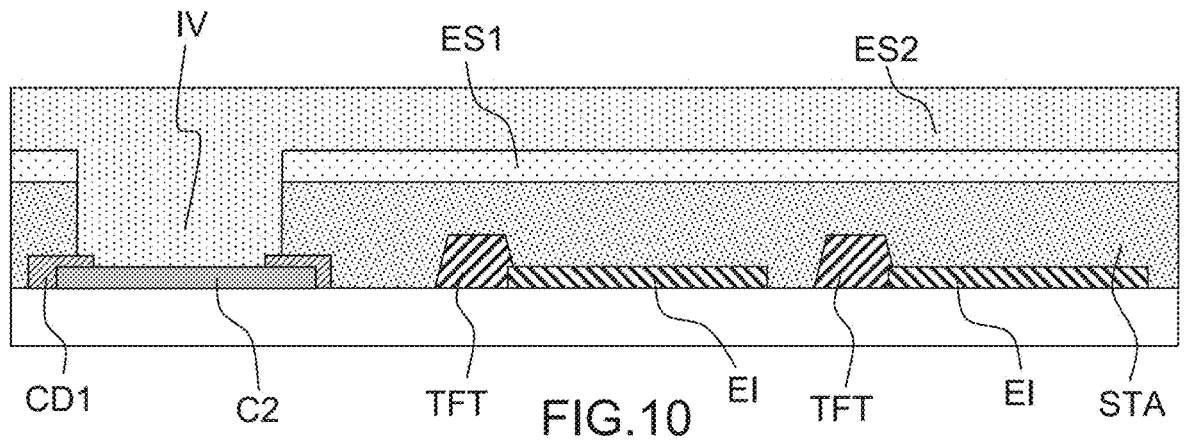
FIG. 10, a device according to yet another variant of said third embodiment of the invention.

A matrix-array device of this type was produced on a panel with a (0.125×311.4×251.4 mm) plastic substrate made of PET including an active matrix array of 284.16 mm×230.88 mm size. This matrix array was composed of organic TFTs (OTFTs) each of which was connected to a bottom electrode EI the surface of which was made of AZO (aluminum-doped zinc oxide). The pitch of the matrix array was 150 µm. A secondary network formed of elements C2 and of buses BI was integrated into the interior of the matrix array. This network was not electrically connected to the rows and columns, but was connected to four contact redistribution pads exterior to the matrix array. The buses BI were parallel to the columns: there was one every 100 columns and each was connected by 3 vertical interconnections IV to the top electrode. The elements C2 and the buses BI were formed from an Au layer of 100 nm thickness. As explained above, they were located in a level below the level of the AZO bottom electrode of the photodiode, the two levels being separated by a buffer layer CDI made of SU8 resist of 4 µm thickness. Advantageously, the source-drain electrodes (or the gate electrodes) of the TFTs are produced in the same level. To produce the vertical interconnections IV between the elements C2 and the top electrode ES made of PEDOT:PSS, it was necessary to encroach upon a portion of the area of the panel occupied by the AZO bottom electrode of the photodiode. Next a photoconverting layer STA was deposited, in the solvent chlorobenzene, by spray coating, its dry thickness being 800 nm after thermal annealing. This layer was a nanostructured mixture of an electron-donor material (poly[(4,8-bis-(2-ethylhexyloxy)-benzo(1,2-b:4,5-b')dithiophene)-2,6-diyl-alt-(4-(2-thylhexanoyl)-thieno[3,4-b]thiophene)-2-6-diyl)], known as PBDTTT-C) and of an electron-acceptor material ([6,6]-phenyl-$C_{71}$-butyric-acid-methyl ester, known as [70]PCBM) with a mass ratio of 1:2. Vias were opened in order to make it possible to form an electrical contact between the Au of the elements C2 and the top electrode. The vias passed through the photoconverting layer and the SU8 dielectric resist. The vias were manufactured by laser ablation using an excimer laser with a wavelength of 24 nm and an energy of 450 mJ per pulse. Next, a PEDOT:PSS layer mixed with Ag nanowires was deposited using a doctor blade on the photoconverting layer in order to form the top electrode. The PEDOT:PSS layer mixed with Ag nanowires had a thickness of 4 µm, a resistivity of 230Ω/☐, and a transmittance of 88% at the wavelength of 520 nm, corresponding to the emission of a scintillator made of CsI:Tl or Gadox. The PEDOT:PSS made contact with the elements C2 through the vias. An encapsulation composed of a barrier PSA and of a barrier film and having a total thickness of 50 µm was then laminated onto the surface of the PEDOT:PSS so as to cover all of the area covered by the organic layers (photoconverting layer and layer of PEDOT:PSS). A (30 µm thick) double-sided adhesive was laminated onto the surface of the barrier film. A Gadox scintillator was then laminated onto this adhesive. The edges of the substrate were passivated by depositing a silicone bead. The contact redistribution pads on two sides of the panel were connected to a printed circuit board (PCB) including the electronics for reading the matrix array, by way of flexible connectors combined with an ACF adhesive so as to allow a digital image to be acquired. The top electrode may also be produced in the form of a multilayer structure. FIG. 10 shows a cross-sectional view of a device of the type in FIG. 8 (conductive elements C2 replacing bottom pixel electrodes) having a top electrode made up of two layers, ES1 and ES2.

A matrix-array device of this type was produced on a (0.7×311.4×251.4 mm) glass panel including an active matrix array of 284.16 mm×230.88 mm size. This matrix array was composed of a-Si:H TFTs each of which was connected to a bottom electrode EI the surface of which was made of FTO (fluorine-doped tin oxide). The pitch of the matrix array was 150 µm. A secondary network formed from elements C2 and buses BI was integrated into the interior of the matrix array. This network was not electrically connected to the rows and columns, but was connected to four contact redistribution pads exterior to the matrix array. The buses BI were parallel to the columns: there was one every 100 columns and each was connected by 3 vertical interconnections IV to the top electrode. To produce the vertical interconnections, it was necessary to sacrifice unitary bottom pixel electrodes. The elements C2 and the interconnecting bus were formed from a Cr/ITO bi-layer of 100 nm/20 nm thickness. Next, a photoconverting layer was deposited, in the solvent chlorobenzene, by spin coating, its dry thickness after thermal annealing being 600 nm. This layer was a nanostructured mixture of an electron-donor material (PCDTBT) and of an electron-acceptor material ([60]PCBM) with a mass ratio of 1:1. A first layer ES1 of PEDOT of 100 nm thickness was deposited on the photoconverting layer, by spin coating. This layer had a dual function: on the one hand, it formed part of the top electrode, and on the other hand, it served as a buffer layer for protecting the photoconverting layer during the manufacture of the vias. These vias were opened in each sacrificial pixel in order to make it possible to form a zone of contact between the ITO of the elements C2 and the second layer of the top electrode. The area of the vias was larger than the non-passivated area of the (Cr/ITO) element C2, in order to avoid the parasitic injection of carriers into the active structure. The vias passed through the photoconverting layer and the first PEDOT layer. The vias were manufactured by photolithography, using a fluorine-containing resist sold by Orthogonal under the reference OSCoR4000. The vias were opened by etching the photoconverting layer in a plasma (80 mT, 100 sccm $O_2$, 400 W, 1000 s). The resist was then removed in a specific solvent (stripper). Next a second conductive level ES2 was deposited by sputtering an ITO layer with a thickness of 200 nm, a resistivity of 20Ω/□, and a transmittance higher than 90% at the wavelength of 520 nm, corresponding to the emission of a scintillator made of CsI:Tl or Gadox. The second PEDOT:PSS layer made contact with the elements C2 through the vias. An encapsulation composed of a barrier adhesive and of a thin glass and having a total thickness of 65 μm was laminated onto the surface of the PEDOT:PSS so as to cover all the area covered by the organic layers (photoconverting layer and layer of PEDOT:PSS). A (30 μm thick) double-sided adhesive was laminated onto the surface of the barrier film. A CsI:Tl scintillator the fibers of which were grown on an aluminum substrate was then laminated onto this adhesive. The edges of the substrate were passivated by depositing a bead of silicone. The contact redistribution pads on two sides of the panel were connected to a printed circuit board (PCB) including the electronics for reading the matrix array, by way of flexible connectors combined with an ACF adhesive so as to allow a digital image to be acquired.

Figure 11:
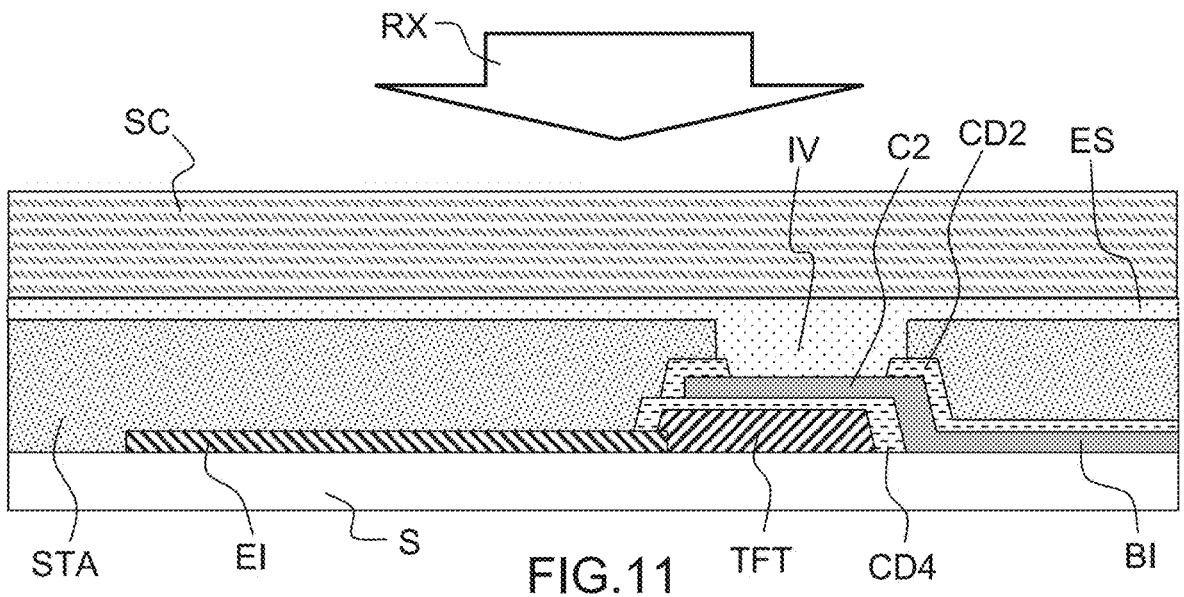
FIG. 11, an x-ray imager based on the device of FIGS. 6A and 6B.

FIG. 11 shows, merely by way of illustration, a cross-sectional view of a matrix-array device of the type in FIGS. 6A and 6B, to the top electrode of which a scintillator SC that emits light when it is irradiated by x-ray radiation RX has been added, in order to produce an x-ray imager for radiology.

A plurality of variants of the invention are possible.

The number and dimensions of the conductive elements C2 may be changed. When these elements are interior to the active matrix array, their unitary area is typically comprised between 20 pmt and 0.25 mm². If these elements replace bottom pixel electrodes, peripheral pixels of the matrix array will preferably be sacrificed.

The contact resistance between the top electrode (for example made of PEDOT:PSS) and the elements C2 must be as small as possible in order to minimize the ohmic drop associated with this contact. The contact resistance is preferably lower than 100 Ω·cm² and more preferably lower than 5 Ω·cm². The elements C2 may be produced with any type of conductor: metals (Al, Cu, Ni, Ag, Au, Pt, Cr, Ti, TiW, etc.), transparent conductive oxides (ITO, IZO, GZO, AZO, FTO, etc.), metal nanowires (Ag, Au, etc.), carbon nanotubes, graphene, etc. They may be made of a mixture or stack of these materials.

As more specifically regards transparent conductive oxides, it should be noted that use thereof to produce the top electrode is generally to be avoided, because of the substantial risk that deposition processes suitable for these materials will degrade the organic active structure, this being the reason why a less conductive material such as PEDOT:PSS is used. In contrast, the use of transparent conductive oxides to produce the elements C2 has no drawbacks. Moreover, conductive oxides deposited on an active semiconductor structure are very resistive, whereas their conductivity is better when they are deposited on an insulating substrate.

In the case of a stack of layers, certain layers may provide adhesion properties (Ti, Cr, etc.), conduction properties (Al, Cu, Au, Ag, etc.) or an interface with the top electrode (Au, ITO, etc.), etc. The interconnecting buses BI are produced from the same materials. They have a thickness that may range from 1 nm to several tens of microns. Preferably, the bus has a thickness of 6 nm to 20 μm. Commonly, when the bus is a vacuum-deposited metal, it has a thickness comprised between 20 nm and 300 nm.

The interface of each element C2 with the top electrode will preferably be ensured by a material that makes a good electrical contact with the latter. By good contact, what is meant is a contact with the lowest possible resistance. To this end an interface material, metals such as ITO, Au, Ag, Pt and Pd, may well be chosen in the case of a top electrode made of PEDOT:PSS. Preferably, the interface layer will be made of Au. This interface layer will possibly have a thickness ranging from 1 nm to a plurality of μm. It will possibly be deposited by printing, electrodeposition, vacuum evaporation, vacuum sputtering, etc.

The resistivity of the elements C2 is at most equal to the resistivity of the PEDOT:PSS layer used for the top electrode, and preferably at least 10 times, or even at least 100 times, lower than the resistivity of the PEDOT:PSS layer used for the top electrode.

In certain embodiments (FIGS. 5B, 6C, 7C) a dielectric layer CD3 is used to prevent the parasitic injection of carriers into the active structure. This layer may be formed from an inorganic, organic or hybrid (organic-inorganic) dielectric or a stack or a mixture of these types of materials. Commonly, the dielectric may be a layer deposited by atomic layer deposition (ALD) ($Al_2O_3$, nanolaminates, $ZrO_2$, etc.), by sputtering or evaporation (SiN, SiON, SiNx, SiOx, parylene, etc.), or by wet processing (S1818, SU8 or BCB photoresist lithography, insulating polymer such as CYTOP®, polystyrene, cyclic olefin polymer, PMMA, etc.). It may also be a self-assembled layer (SAM) on the surface of the elements C2 (e.g.: octadecyltrichlorosilane). The thickness of the dielectric layer is typically comprised between 0.5 nm and 20 μm.

In other embodiments (FIG. 5C) the parasitic injection of carriers into the active structure is avoided by virtue of the use, in the elements C2, of a material having a work function chosen to prevent the injection of parasitic charges into the active layer. When the device is biased so as to ensure normal operation thereof (negative bias in the case of a photodiode biased via the anode electrode), a potential barrier forms, between the element C2 and the active structure STA, that prevents the injection of carriers from the element C2 into said structure STA. The height of this barrier must be at least 0.3 eV and preferably at least 0.5 eV. More particularly:

If the active structure STA forms a photodiode and the top electrode ES is the anode of this photodiode, the potential barrier between the element C2 and the active structure must be large enough to prevent the injection of electrons from the interconnection into the multilayer structure when the top electrode is negatively biased and in the dark.

If the active structure STA forms a photodiode and the top electrode ES is the cathode of this photodiode, the potential barrier between the element C2 and the active structure must be large enough to prevent the injection of holes from the interconnection into the multilayer structure when the top electrode is positively biased and in the dark.

Vias are created in the levels between the top electrode and the element C2, in order to make it possible to create contact zones. These vias are manufactured using techniques used in the microelectronics field, such as photolithography combined with dry-etching (plasma etching) or wet-etching (dissolution) techniques, laser ablation (excimer laser at 248 nm, excimer laser 308 nm, YAG laser at 532 nm, YAG laser at 1064 nm), mechanical punching, or a combination of these various techniques. They may also be manufactured using the process described in document FR2925222 or any other technique known to those skilled in the art. The size of the vias ranges from 1 $\mu m^2$ to a plurality of $mm^2$. Commonly, the areas of the vias are about 100 $\mu m^2$ to 25000 $\mu m^2$.

The active structure STA may be a layer made of organic or inorganic material or of a hybrid organic-inorganic mixture or a stack of organic and/or inorganic and/or hybrid layers. It has a thickness between 20 nm and 3 mm. In the case of indirect detection of x-rays, it has a thickness of about 50 nm to 2 $\mu m$. Preferably, this structure is, for example, a nanostructured mixture of two organic semiconductors, an electron donor (RR P3HT, PCDTBT, PCPDTBT, PTAA, etc.) and an electron acceptor (C60, C70, 60PCBM, 70PCBM, 80PCBM, ICBA, derivative of acene diimide, P(ND12HD-T), etc.). It may be deposited by wet processing or using printing techniques (inkjet printing, screen printing, spin coating, doctor-blade coating, slot-die coating, rotogravure printing, flexographic printing, spraying, etc.). It may also be a question of a layer of organic-inorganic methylammonium lead halide perovskite. It may be deposited by wet processing or using printing techniques (screen printing, spin coating, doctor-blade coating, slot-die coating, spraying, etc.). Interface layers such as layers for pinning the work function of the electrodes or hole-blocking layers and electron-blocking layers may be inserted between the photoconverting layer and the two (bottom and top) electrodes.

The top electrode ES is advantageously based on PEDOT:PSS but may also be composed of a layer or multilayer of other materials based on PEDOT that differ in properties such as the type of dopants; the ratio of dopants; their molar mass; their macromolecular structure; additives, solvents or fillers that they contain; etc. This layer is about 1 nm to 10 $\mu m$ thick and may be deposited by wet processing or using printing techniques (inkjet printing, screen printing, spin coating, doctor-blade coating, slot-die coating, rotogravure printing, flexographic printing, spraying, etc.). The layer advantageously has a thickness of 300 nm, for a conductivity of 70Ω/□ and a transmittance of 83% at the wavelength of 520 nm.

The invention is also applicable when the top electrode is made of one or more other materials that are not based on PEDOT. These materials may be polyaniline (PANI), a transparent conductive oxide (ITO, AZO, GZO, etc.), a tri-layer based on metal oxides ($MoO_x$/Ag/$MoO_x$, etc.), a network of conductive nanowires (Ag, Cu, Au, etc.), a network of carbon nanotubes, graphene, a thin metal such as Ag, Au, Al (1 nm to 20 nm).

The bottom electrodes define pixels that may have various dimensions and shapes, with, preferably, an area no larger than 0.25 $mm^2$.

The invention claimed is:

1. A matrix-array optoelectronic device comprising:
an electrically insulating substrate bearing, on one of its surfaces, a matrix array of bottom electrodes and a transistor connected to said bottom electrode;
an active structure arranged above said matrix-array of bottom electrodes, said active structure being configured to produce information according to a light detected and connected to said bottom electrode;
at least one top electrode lying above said active structure, said top electrode being transparent to the light emitted or detected by the active structure;
at least one conductive element that is borne by the substrate without interposition of said active structure between said at least one conductive element and the substrate and that is directly connected to said top electrode by at least one vertical interconnection, said conductive element having an electrical resistivity lower than that of said top electrode; and
a plurality of photosensitive pixels, each pixel comprising a photodiode formed by said active structure, said bottom electrode, and said top electrode, wherein said bottom electrode is connected to said at least one conductive element of the matrix-array optoelectronic device to read each pixel individually,
wherein said at least one vertical interconnection is formed from a material having a work function of value chosen so that an application, across the top electrode and at least the bottom electrodes that are closest to said vertical interconnection, of a potential difference that allows said active structure to detect said light, causes the appearance of a potential barrier that prevents the injection of parasitic electrical charge into said bottom electrodes through the active structure,
wherein said photodiode and said transistor forms a photodetector.

2. The matrix-array optoelectronic device as claimed in claim 1, wherein said bottom electrodes define pixels of area no larger than 0.25 $mm^2$.

3. The matrix-array optoelectronic device as claimed in claim 1, wherein said vertical interconnection passes through said active structure.

4. The matrix-array optoelectronic device as claimed in claim 3, wherein said or at least one said conductive element is arranged on a substrate region that is located interior to said matrix array of bottom electrodes.

5. The matrix-array optoelectronic device as claimed in claim 4, also comprising a thin-film transistor that is electrically connected and adjacent to each said bottom electrode, said or at least one said conductive element being arranged above a said thin-film transistor, but without direct electrical connection with this transistor.

6. The matrix-array optoelectronic device as claimed in claim 4, wherein said or at least one said conductive element is arranged in an aperture in a said lower electrode, said aperture having an area no larger than 10% of the area of the bottom electrode.

7. The matrix-array optoelectronic device as claimed in claim 4, wherein said or at least one said conductive element replaces at least one said bottom electrode of the matrix array.

8. The matrix-array optoelectronic device as claimed in claim 4, wherein said bottom electrodes are borne by a dielectric layer that is deposited on said substrate, whereas said or at least one said conductive element is arranged above said dielectric layer.

9. The matrix-array optoelectronic device as claimed in claim 3, wherein said or at least one said conductive element is arranged on a peripheral region of the substrate, said region being located exterior to said matrix array of bottom electrodes.

10. The matrix-array optoelectronic device as claimed in claim 3, wherein said or at least one said vertical interconnection has a larger lateral extent then the corresponding conductive element, so as to separate it from said active structure.

11. The matrix-array optoelectronic device as claimed in claim 3, wherein, beyond said vertical interconnection, said or at least one said conductive element is covered with a dielectric layer, so as to separate it from said active structure.

12. The matrix-array optoelectronic device as claimed in claim 3, wherein said or at least one said conductive element is formed from a material having a work function of value chosen to cause the appearance of a potential barrier with said active structure when said potential difference is applied across the top electrode and said bottom electrodes.

13. The matrix-array optoelectronic device as claimed in claim 1, wherein said at least one conductive element is arranged on a peripheral region of the substrate, said region being located exterior to said matrix array of bottom electrodes, which is not covered by said active structure, and forms a bus that borders at least one edge, and preferably two contiguous edges, of said matrix array.

14. The matrix-array optoelectronic device as claimed in claim 13, wherein a plurality of said at least one conductive elements at least partially encircle said matrix array of bottom electrodes.

15. The matrix-array optoelectronic device as claimed in claim 13, wherein said one or more said at least one vertical interconnections and said bus are dimensioned such that the electrical resistance between said bus and said top electrode is lower than or equal to 20 Ohms.

16. The matrix-array optoelectronic device as claimed in claim 1, comprising a plurality of said at least one conductive elements connected together by a bus.

17. The matrix-array optoelectronic device as claimed in claim 1, wherein said active structure extends continuously above said matrix array of bottom electrodes and comprises at least one layer containing at least one organic material.

18. The matrix-array optoelectronic device as claimed in claim 17, wherein said top electrode is based on PEDOT.

19. The matrix-array optoelectronic device as claimed in claim 1, wherein said or at least one said vertical interconnection is made of the same material as the top electrode.

20. The matrix-array optoelectronic device as claimed in claim 1, wherein said active structure is a photoconverting structure that interacts with said top and bottom electrodes to form a photodiode device and to thus create a matrix array of photodetectors.

21. The matrix-array optoelectronic device as claimed in claim 20, also comprising a layer made of scintillator material, said layer being fastened above said top electrode, so as to form an x-ray imager.

* * * * *